Oct. 9, 1962 G. A. NAAB ETAL 3,058,037
PRINTED CIRCUIT COMPONENT AND ASSEMBLY
Filed Feb. 17, 1959
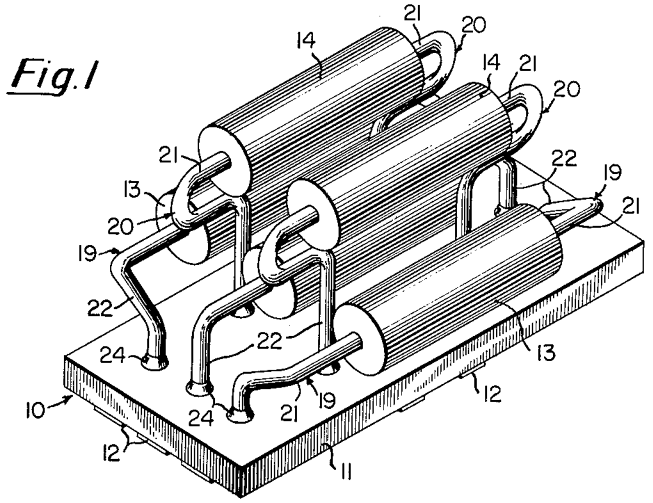
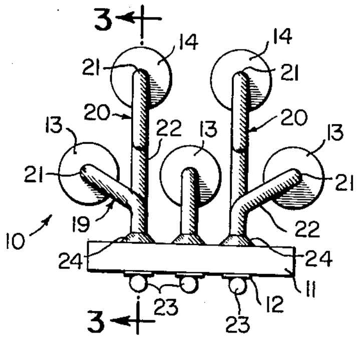
Fig. 2
Fig. 3
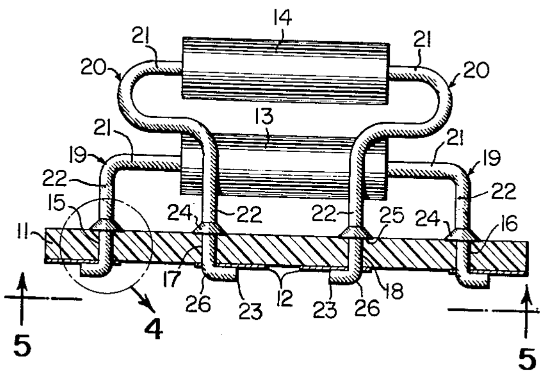
Fig. 4
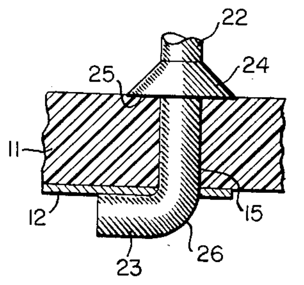
Fig. 5
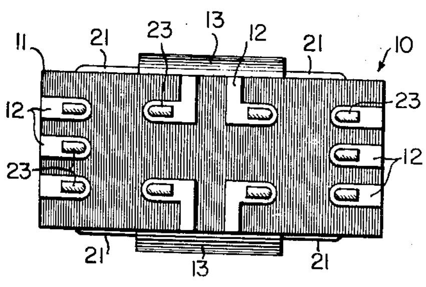
INVENTORS.
GERARD A. NAAB
FRANK J. SARLO, JR.
BY *William R. Nolte*
AGENT United States Patent Office 3,058,037
Patented Oct. 9, 1962

3,058,037

PRINTED CIRCUIT COMPONENT AND ASSEMBLY

Gerard A. Naab, Morton, and Frank J. Sarlo, Jr., Broomall, Pa., assignors to Burroughs Corporation, Detroit, Mich., a corporation of Michigan Filed Feb. 17, 1959, Ser. No. 793,804
4 Claims. (Cl. 317—101)

This invention relates to electrical components and their assembly with printed circuits.

Printed circuits are now in wide use and one of their principal advantages is that components such as condensers, resistors, transistors and the like can be assembled therewith by automated processes ensuring good electrical connection with the printed wiring by dip soldering or spot weldings. Heretofore, a conventional method of mounting electrical components on a printed circuit board or panel involves inserting the lead wires which extend from each component into holes in the printed circuit board with their ends projecting from the other side of the board. The component is positioned at the proper height from the surface of the board by means of a spacer block and the protruding ends of the leads are then bent or clinched into contact with the printed wiring on the board. The bent portion of each lead wire is then soldered to its associated conductive portion with the spacer remaining in place. When the solder has hardened the spacer is then removed, but with difficulty. Moreover, with the present tendency toward miniaturization of printed circuits and high density assembly of components, disadvantages of this method become intensified.

Still another disadvantage of the former construction is the stress placed upon the panel in the area surrounding the holes through which the leads of the component extend. When the ends of the leads are clinched over on the bottom of the panel there is a counteracting force against the walls of the hole, which force is concentrated against the top edge of the hole at a point opposite to the direction of the clinching force, oftentimes resulting in damage to the board at that point.

It is an object of the present invention to overcome the above disadvantages by providing a novel assembly of electrical components with printed circuit boards.

Another object of the invention is to provide a novel component structure particularly adapted for use with printed circuit assemblies.

In accordance with the above objects and first briefly described the invention contemplates the provision of a printed circuit assembly including electrical components having novel means which include integral positioning and fastening portions for rigidly securing the components in spaced relation to a printed circuit panel.

Other objects of the invention will appear from the following description, reference being made to the drawing in which:

FIG. 1 is a perspective view of an assembly showing a cluster of electrical components secured to a printed circuit board in accordance with the present invention;

FIG. 2 is an end view of the assembly shown in FIG. 1;

FIG. 3 is a longitudinal sectional view taken along line 3—3 of FIG. 2;

FIG. 4 is an enlarged view of a fragmentary portion of FIG. 3; and

FIG. 5 is a bottom view of the assembly taken along the line 5—5 of FIG. 3.

Referring to FIG. 1 of the drawing, a printed circuit assembly generally indicated at 10 is shown comprising a board or panel 11 of suitable electrical insulating material which may be clad with electrically conductive strips 12 on top and bottom surfaces thereof but herein shown as being on the underside of the board. Mounted on the printed circuit panel is a compact cluster of electrical components in superposed rows, the lower row of components being identified at 13 and the upper row at 14. At points where the components are to be attached, the conductive strips 12 and the panel 11 are drilled or otherwise provided with aligned holes 15 and 16 for components 13 and holes 17 and 18 for components 14.

As shown in the drawing the electrical components 13 and 14, which may be resistors, condensers, transistors and the like, have substantially cylindrical body portions but may assume other configurations of non-regular form. Extending from opposite ends of each component body portion are a pair of leads, the leads for the lower row of components being identified at 19 and the leads for the upper row at 20. The leads extend into appropriate holes from that side of the panel which is opposite to the side on which the printed circuit strips 12 are formed. The leads are stiff enough to support their respective components, yet capable of being bent into desired shapes such as the configurations shown. Each lead has a portion 21 extending axially away from the component for a short distance and a portion 22 bent downwardly from portion 21 thereof. The center to center distance between the outer end portions 22 of the leads from a particular component is such as to fit into the two holes 15 and 16 or 17 and 18 depending upon whether the leads are associated with the lower or upper row of components. The outer end sections of the leads have a length sufficient to protrude through the holes to provide free ends 23 which are clinched or bent into contact with the printed circuit conductor strips 12 as shown in FIGS. 3 and 4.

A principal feature of the invention is the provision of a headed portion or flange 24 integrally formed at each outer end portion 22 of the leads and which serves as a positioning element. The headed portions are of greater diameter than the holes in the board and include a flat face or shoulder 25 extending perpendicular to the axis of the lead which engages the top surface of the printed circuit panel to limit the penetration of the lead wires into their associated holes and correspondingly space the components a suitable distance from the printed circuit panel. When so positioned, the protruding extremities or free ends 23 of the leads are bent over at 26 to engage the conductive strips 12. The bending forces applied to each free end 23 tends to pull the lead axially through the hole in the direction toward the surface containing the conductive strips. Axial movement of the lead however is limited by the flange 24 which by means of its flat face 25 engages the top surface of the panel at the margins of the hole. Thus all of the axial thrust produced in the lead by the bending operation is resisted by reactive bearing forces distributed over the entire area of flat face 25. By virtue of this stress distribution, damage to the panel at the margins of the holes is virtually eliminated. The bent portions 26 cooperate with the flanges 24 to firmly grip the board or panel 11 therebetween, to thereby firmly lock and anchor each lead and its associated component to the printed circuit panel.

The headed portions 24 which serve as positioning elements are formed from the wire itself by any suitable manner such as cold heading, swedging, or rolling, and can be applied to the electrical component leads before, during or after the fabrication of the electrical component itself.

With the above described construction, when a component is inserted in a printed circuit panel and pushed into place, the elements 24 operate to position the components a predetermined distance from the panel. After all of the free ends of the leads have been clinched over into contact with the printed circuit pads the panel can then be dipped in molten solder which will solder the ends of the leads to the printed circuit pads on the bottom surface of the circuit board. It is thus seen that no means in addition to the components themselves are required for holding them in place once the free ends of the leads have been clinched into contact with the electrical circuit pads, nor is there any danger of the component becoming displaced during the interval between the bending of the extremities of the leads and their additional bonding connection by solder.

From the foregoing description it will be appreciated that the present invention provides a very simple and inexpensive printed circuit assembly including a novel electrical component for assembly therewith and wherein proper positioning and positive electrical connection of the component leads with the printed circuits is attained with a minimum expenditure of time and effort. Having thus described the preferred embodiment of the invention for purposes of illustration, it is to be understood that the inventive concept may be embodied in other forms without departing from the scope of the invention.

What is claimed is:

1. A printed circuit assembly including, in combination, an insulating panel provided on a surface thereof with electrically conductive strips and having laterally spaced holes extending through the panel, said conductive strips having portions thereof terminating adjacent the marginal edges of said holes, an electrical component, at least a single wire lead projecting from the component and having a portion extending through one of said holes, said one hole being of substantially the same diameter as said wire lead, said wire lead having a deformation, said deformation being formed from the lead material itself to extend beyond the margins of said one hole and serving as a shoulder for seating engagement with the panel to limit the entry of the lead wire in the hole, said lead wire having an end portion bent into engagement with the conductor terminating adjacent said one hole, said deformation thereby providing a solid support opposite the bend in the lead wire to permit the end portion thereof to be tightly formed against the conductor.

2. A printed circuit assembly including an insulating panel provided with electrical conductors on a surface thereof and having a pair of lateraly spaced holes extending through the panel, said conductors having portions thereof terminating adjacent the marginal edges of said holes, an electrical component spaced from one surface of said panel, wire leads projecting from the component and having portions extending through said holes, each of said leads being of substantially the same diameter as its associated hole, each lead having a deformation, said deformation being formed from the lead itself to extend beyond the margins of its associated hole and serving as a shoulder for seating engagement with one surface of said panel to limit the entry of the lead in the hole, each said lead having an end portion bent into engagement with the conductor terminating adjacent its associated hole, said deformation thereby providing a solid support opposite the bend in the lead so that the end portion thereof may be tightly formed against the conductor.

3. A printed circuit assembly including a thin insulating panel provided on its bottom surface with electrical conductors and having a pair of spaced holes through said panel, said electrical conductors having portions thereof terminating adjacent the marginal edges of said holes, a cluster of electrical components spaced varying distances from the top surface of the panel, wire leads projecting in opposite directions from opposite ends of the components, each lead having an inner end portion extending substantially parallel to the panel and an outer end portion extending substantially perpendicular thereto and through one of said holes, said outer end portion of each lead including a flange portion of enlarged cross-sectional area to constitute a shoulder-like configuration formed from the lead material itself for seating engagement with the top surface of the panel in the marginal area defining the hole and further including a length bent into engagement with a conductor on the bottom surface of the panel, whereby each of said leads is firmly locked into engagement with said panel and said components are supported in spaced relationship to the panel.

4. A printed circuit assembly including a thin insulating panel provided on its bottom surface with electrical conductors having pairs of spaced holes through said panel, said electrical conductors having portions thereof terminating adjacent the marginal edges of said holes, a cluster of compactly arranged electrical components disposed in top and bottom superposed rows, wire leads projecting in opposite directions from opposite sides of the components, each of said leads having an inner end portion extending substantially parallel to the panel and an outer end portion extending substantially perpendicular thereto and wherein the outer end portions of said top row of components extend between the inner end portions of the bottom row of said components, said outer end portions of each lead including a flange portion of enlarged cross-sectional area, the latter constituting a shoulder-like configuration formed from the lead material itself and including a planar face normal to the axis of the end portion for seating engagement with the top surface of the panel in the marginal area defining the hole, said outer end portion of each lead further including a length bent into engagement with the adjoining conductor on the bottom surface of the panel whereby each of said leads is anchored into engagement with the top and bottom surfaces of said panel, and said rows of components are thereby spaced varying distances from the top surface of said panel.

References Cited in the file of this patent

UNITED STATES PATENTS

| | | |
|---|---|---|
| 2,898,518 | Lynn | Aug. 4, 1959 |
| 2,902,629 | Little | Sept. 1, 1959 |

OTHER REFERENCES

Tele-Tech and Electronic Industries, June 1954.
Electronics, February 1955; p. 104.